(12) United States Patent
Lai

(10) Patent No.: US 9,187,841 B2
(45) Date of Patent: Nov. 17, 2015

(54) METHOD OF FORMING SKID-PROOF LEATHER-TEXTURE SURFACE ON METALLIC SUBSTRATE

(71) Applicant: CATCHER TECHNOLOGY CO., LTD., Tainan (TW)

(72) Inventor: Feng-Ju Lai, Taipei (TW)

(73) Assignee: CATCHER TECHNOLOGY CO., LTD., Tainan (TW)

(*) Notice: Subject to any disclaimer, the term of this patent is extended or adjusted under 35 U.S.C. 154(b) by 0 days.

(21) Appl. No.: 14/489,588

(22) Filed: Sep. 18, 2014

(65) Prior Publication Data

US 2015/0001090 A1 Jan. 1, 2015

Related U.S. Application Data

(63) Continuation-in-part of application No. 13/587,901, filed on Aug. 16, 2012, now abandoned.

(51) Int. Cl.
| | |
|---|---|
| C25D 11/16 | (2006.01) |
| C25D 11/24 | (2006.01) |
| C25D 11/04 | (2006.01) |
| C25D 11/08 | (2006.01) |
| H05K 5/02 | (2006.01) |

(52) U.S. Cl.
CPC .............. *C25D 11/16* (2013.01); *C25D 11/08* (2013.01); *C25D 11/24* (2013.01); *C25D 11/243* (2013.01); *C25D 11/246* (2013.01); *H05K 5/0243* (2013.01)

(58) Field of Classification Search
CPC ................ C25D 11/16; C25D 11/02–11/34
USPC ................................................. 205/205–214
See application file for complete search history.

(56) References Cited

U.S. PATENT DOCUMENTS

| | | | | |
|---|---|---|---|---|
| 3,052,582 | A | * | 9/1962 | Herman ................. 216/109 |
| 5,895,563 | A | * | 4/1999 | Muranushi ............. 205/210 |
| 2007/0066503 | A1 | * | 3/2007 | Basaly .................... 510/238 |

FOREIGN PATENT DOCUMENTS

| | | |
|---|---|---|
| CN | 1271652 A | 11/2000 |
| CN | 101205616 A | 6/2008 |

(Continued)

OTHER PUBLICATIONS

Dehai Zheng, "The printed application examples of current age", p. 225-226, Mar. 31, 2003, Chemical Industry Publishing Company, Beijing.

*Primary Examiner* — James Lin
*Assistant Examiner* — Brian W Cohen
(74) *Attorney, Agent, or Firm* — Li&Cai Intellectual Property (USA) Office

(57) ABSTRACT

A method of forming a skid-proof leather-texture surface on a metallic substrate, including the following steps of: providing a metallic substrate; roughening the surface of the metallic substrate by performing sand-blasting; performing a first pretreatment to clean the surface of the metallic substrate; etching the surface of the metallic substrate through an etchant while using a etch-moderating agent to moderate the condition of etching performing a second pretreatment, such as pickling or chemical polishing, on the surface of the metallic substrate; performing an anodic treatment on the surface of the metallic substrate to form an oxidized film having micro-porous structure thereon; activating the surface of the metallic substrate after the anodic treatment; dyeing the surface of the metallic substrate; sealing the micro-porous structure formed on the surface of the metallic substrate; and ash-removing to clean the metallic substrate.

14 Claims, 3 Drawing Sheets

(56) References Cited

FOREIGN PATENT DOCUMENTS

| CN | 101519016 A | 9/2009 |
| CN | 101845654 A | 9/2010 |
| CN | 102170763 A | 8/2011 |
| CN | 102206821 A | 11/2011 |

* cited by examiner

METHOD OF FORMING SKID-PROOF LEATHER-TEXTURE SURFACE ON METALLIC SUBSTRATE

CROSS REFERENCE TO RELATED APPLICATIONS

This application is a Continuation-in-Part of application Ser. No. 13/587,901, filed Aug. 16, 2012, now pending, and entitled METHOD OF FORMING SKID-PROOF LEATHER-TEXTURE SURFACE ON METALLIC SUBSTRATE.

BACKGROUND OF THE INSTANT DISCLOSURE

1. Field of the Instant Disclosure

The instant disclosure relates to a method of forming a skid-proof leather-texture surface on a metallic substrate; in particular, to a metal surface treatment technology to form a skid-proof leather-texture surface on a metallic substrate 2. Description of Related Art Generally, the metal surface treatment on a metallic surface refers to the furnishing of a metallic surface after an initial fabrication process to change the surface feature of the surface through chemical or mechanical means. Where such method is also known as the process of metal surface furnishing Nowadays, more and more electronic products have their metallic housings or components furnished to be more aesthetically appealing while increasing their values. These processes include plating, anodizing, coating and etc.

For those electronic products having a shorter life cycle, the influence of the appearance of such products is yet more important. These electronic products have to be apparently attractive enough in order to stimulate the consumer's impulse to purchase them within the shortest time. However, the metallic housings of such products are often processed to be shiny and smooth and this may seem slippery for the consumers in some aspect.

To address the above issues, the inventors strive via industrial experience and academic research to present the instant disclosure, which can effectively improve the limitations described above.

SUMMARY OF THE INSTANT DISCLOSURE

The object of the instant disclosure is to provide a method of forming a skid-proof leather-texture surface on a metallic surface. A delicate particle structure is formed on the surface of the metallic substrate to overcome the problem of the surface being too slippery. Furthermore, such structure can also provide the users with a skid-proof leather-texture sensation.

In order to achieve the aforementioned objects, according to an embodiment of the instant disclosure, a method of forming a skid-proof leather-texture surface on a metallic substrate, comprising the following steps of: providing a metallic substrate, roughening the surface of the metallic substrate by performing sand-blasting with ceramic beads, wherein the roughness of the surface of the metallic substrate exhibiting a Ra value smaller than 1.1 µm and a RPC value between 100~200/cm; cleaning the surface of the metallic substrate; etching the surface of the metallic substrate by an etchant at an etching temperature of 40±5 degrees in an etching time between 1 to 15 minutes while using an etch-moderating agent to moderate the condition of etching, wherein the etchant comprises a final volume percentage of 50%-75% of ammonium bifluoride, 10%-20% of ammonium sulfate, 5~8% of mono-ammonium phosphate, 1%-3% of triammonium phosphate, and 1%-2% of ammonium oxalate, wherein the etch-moderating agent comprises 50 PPM of sodium dodecylbenzenesulfonate; chemical polishing the etched surface of the metallic substrate, wherein the gloss of the chemical polished surface is smaller than 6; anodically treating the chemical polished surface of the metallic substrate to form an oxidized film having micro-porous structure thereon; activating the micro-porous structure of the oxidized film; dyeing the activated micro-porous structure of the oxidized film; sealing the dyed micro-porous structure of the oxidized film; and removing ash from the metallic substrate and the dyed micro-porous structure.

According to an embodiment of the instant disclosure, the step of performing the first pretreatment on the metallic substrate includes a sub-procedure of degreasing and water rinsing on the surface of the metallic substrate.

Based on the above, the instant disclosure has the following advantages: the texture of the surface formed through the etching process of the instant disclosure is similar to a leather-texture surface having an irregular, uneven structure.

According to an embodiment of the instant disclosure, the process of performing the second pretreatment on the surface of the metallic substrate includes a pickling and a chemical polishing process to produce a foggy surface on the metallic substrate. Furthermore, an anodic treatment is implemented on the uneven structure to form a more delicate particle structure.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
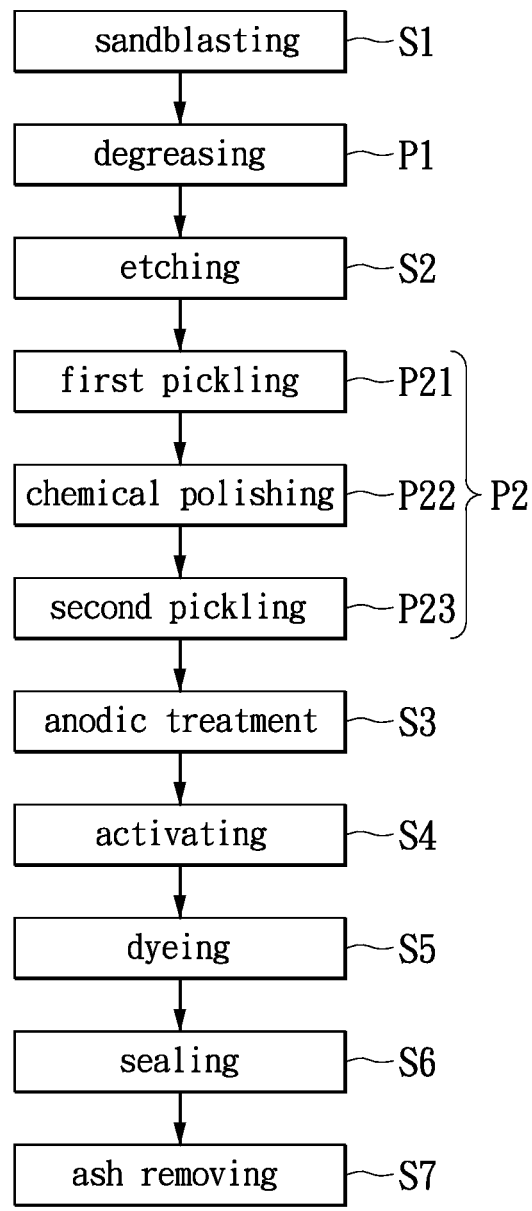
FIG. 1 shows a flowchart of a method of forming a skid-proof leather-texture surface on a metallic substrate in accordance to the instant disclosure.

Please refer to FIG. 1 which shows a flowchart of a method of forming a skid-proof leather-texture surface on a metallic substrate in accordance to the instant disclosure. First of all, for the method of forming the skid-proof leather-texture surface disclosed in the instant disclosure, a metallic substrate is provided. Furthermore, the instant embodiment takes the metallic housings of electronic devices for example, and in order to be in accordance to the latter procedures, an aluminum alloy substrate is adopted. Preferably, the instant embodiment utilizes the aluminum alloys of the 5000 and 6000 series coded in the Aluminum Association, where the aluminum in the 5000 series are alloyed with magnesium, and the aluminum in the 6000 series are alloyed with magnesium and silicon.

The physical structure of the metallic substrate can be designed according to practical needs through mechanical processing. Please refer to FIG. 1, a sandblasting process S1 (abrasive blasting process) can be performed on the metallic substrate prior to other processes in some cases. The sandblasting process S1 is carried out with ceramic beads to roughen the surface of the metallic substrate. And the proper roughness of the surface of the metallic substrate shall exhibit a Ra (roughness average, the arithmetic average of the absolute values of the roughness profile ordinates) value smaller than 1.1 μm and a RPC (Peak counts: the number of roughness profile peaks per a unit length that rise above some predetermined line.) value between 100 to 200 per cm (centimeter). Preferably, the ceramic beads could be zirconia powder only, aluminum oxide powder only, or mixed sand comprises zirconia powder and aluminum oxide powder. If the mixed sand of the two kinds of ceramic beads material is used, the proportion of the zirconia powder and the aluminum oxide power is not further limited. The above desired roughness can be achieved more easily and effectively through the above sandblasting process. In the following descriptions, the processing steps upon the metallic surface, the implementable parameters and the preferred parameters will be provided herein.

Generally, there will be stains or oil remained on the aluminum alloy substrate after the mechanical process. Therefore, the surface of the aluminum alloy substrate can be cleaned first before beginning the latter procedures. For the instant embodiment, with reference to FIG. 1, the degreasing process P1 is implemented to remove the oil or stains adhere to the substrate surface. This process can also be seemed as the first pretreatment.

For the parameters of the degreasing process, a degreasing agent having a concentration of 1 to 50% can be utilized under a temperature that ranges from 10 to 90 degree Celsius, where the concentration of the degreasing agent can also be adjusted according to practical needs. Since the instant embodiment utilizes the metallic housings of electronic devices for example, a preferred parameter for the degreasing process utilizes a degreasing agent having a concentration that ranges from 3 to 5% under a temperature which is approximately 50 degree Celsius (note that all temperatures mentioned hereinafter refer to degree Celsius).

At least one time of water rinsing is required after the degreasing process to remove the remaining degreasing agent, where the number of times of water rinsing can range from 1 to 5 times, and the temperature can range from 5 to 95 degrees. Preferably, the water rinsing process is implemented twice where the temperature is 25 degrees. In the latter procedures, regarding the water rinsing processes required to remove the chemical substances remained from the prior procedure, the parameters of the water rinsing process is described in the above and shall not provide any further illustrations.

Figure 2:
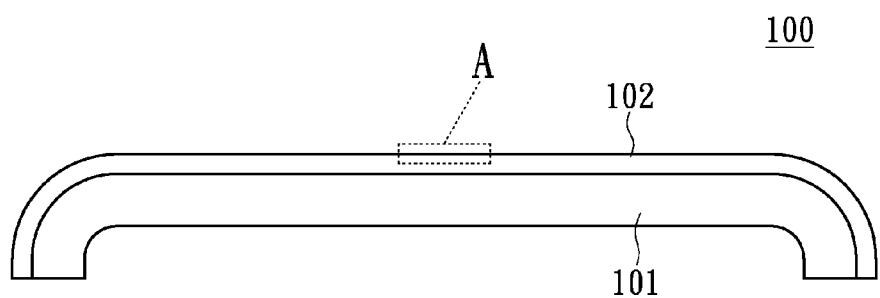
FIG. 2 shows a perspective view of the metallic substrate in accordance to the instant disclosure.
Figure 2A:
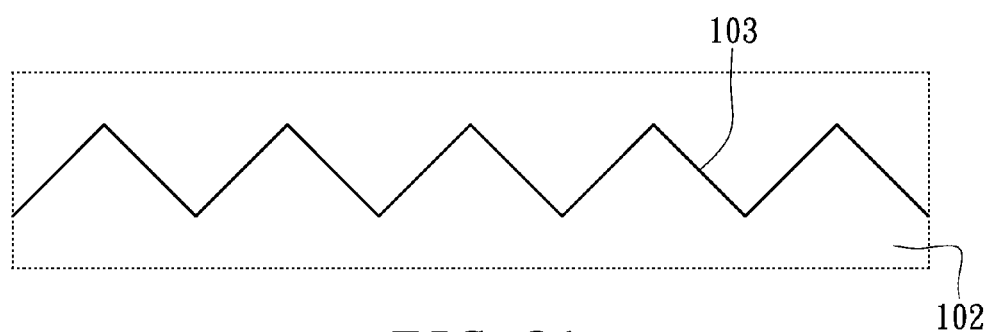
FIG. 2A shows a partially enlarged view of the portion A in FIG. 2.
Figure 3:
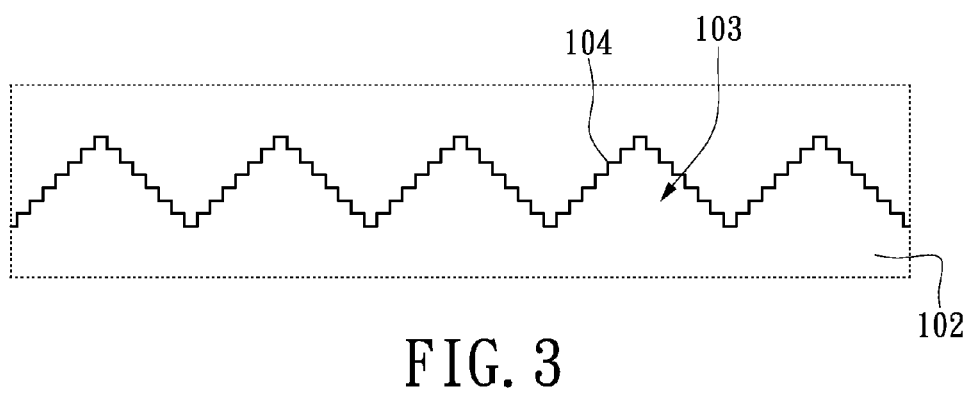
FIG. 3 shows a perspective view of the surface of the metallic substrate after the etching step of the forming method in the instant disclosure.

Followed by the etching process S2 which etches the surface of the metallic substrate by using a chemical solution. Specifically speaking, the etchant is utilized to etch the surface of the metallic substrate and the etch-moderating agent (also known as the etch-control agent) is utilized to moderate the etching condition. For the instant disclosure, the metallic substrate is etched, particularly accompanied by the etch-moderating agent, before the anodic treatment is implemented to form a leather-texture, uneven structure on the surface of the metallic substrate, shown in FIGS. 2 and 2A. FIG. 2 shows a cross-sectional perspective view of a metallic substrate 100, including a base layer 101 and a surface layer 102. FIG. 2A shows a partially enlarged view of the portion A in FIG. 2, where FIG. 2A is also a comparative figure with respect to FIG. 3, for FIG. 2A shows the surface of the metallic substrate without the moderation of the etch-moderating agent. FIG. 3 shows an uneven structure 104 formed on the surface layer 103 after etching through the companion of the etch-moderating agent. It is worth noting that these figures only reveal perspective views of the instant disclosure, where the surface of the metallic substrate will have substantially arched, irregular, uneven structure formed thereon to have special textures after the etching process.

For the instant embodiment, the etchant is a solution containing at least one type of transitional metal salt. To provide further explanations, the etchant can be a solution containing at least one type of transitional metal salt selected from the group consisting of iron, copper, nickel metal salt and a mixture thereof, such as the iron chloride, copper sulfate, nickel sulfate, where the concentration thereof can range from 0.1 to 10 g/L. The etch-moderating agent can be a long-chain surface-active agent, where the etch-moderating agent can be a solution selected from the group consisting of cations, anions, non-ion long-chain surface-active agents and a mixture thereof, where the concentration of the etch-moderating agent can range from 1 to 500 PPM (part per million).

For the etching process of the instant embodiment, three preferred parameters, a first parameter, a second parameter and a third parameter, are provided. The first parameter includes an etchant having a final concentration of 3.2 g/L (PPT) of iron chloride ($FeCl_3$) and 0.6 g/L (PPT) of copper sulfate ($CuSO_4$). The second parameter includes the other etchant having a final volume percentage concentration (w/v) of 50%-75% of ammonium bifluoride ($NH_4HF_2$), 10%-20% of ammonium sulfate [$(NH_4)_2SO_4$], 5~8% of mono-ammonium phosphate ($NH_4H_2PO_4$), 1%-3% of triammonium phosphate [$(NH_4)_3PO_4$], and 1%-2% of ammonium oxalate ($(NH_4)_2C_2O_4$). In most cases, the etching process can be performed only by first parameter or only by the second parameter. In particular, etching efficiency obtained by means of the second parameter is higher than that obtained by means of the first parameter. Higher etching efficiency also results in a faster etching speed to the metal substrate, such that skid-proof leather-texture sensation can be achieved more easily by the second parameter than that by the first parameter. Additionally, residue of copper metal particles would be easily left on the metallic substrate by using first parameter, leading to an unavoidable pickling procedure by acidic reagent. However, the residues of copper metal particles are not that easy to be removed actually, bringing about an abnormal contamination that negatively influences on reagents used in subsequent processes. If the second parameter is used alone, the above-mentioned issue of copper metal particles will be absent, and the negative influences on reagents used in subsequent processes could be prevented. Nevertheless, the etching process can also be performed by the combination of the first parameter and the second parameter, which is the third parameter, depending on practical need. And the combination of the first and the second parameter includes a final concentration (w/v) of 50%-75% of ammonium bifluoride ($NH_4HF_2$), 10%-20% of ammonium sulfate [$(NH_4)_2SO_4$], 5~8% of mono-ammonium phosphate ($NH_4H_2PO_4$), 1%-3% of triammonium phosphate [$(NH_4)_3PO_4$], 1%-2% of ammonium oxalate ($(NH_4)_2C_2O_4$), 0.32% (w/v) of iron chloride, and 0.06% (w/v) of copper sulfate. Furthermore, the etch-moderating agent including sodium dodecylbenzenesulfonate of 50

PPM, where the temperature is 40±5 degrees, is introduced after etching process. Furthermore, the time spent for the etching process lasts for 1-15 minutes and can be adjusted to practical needs. For the etching process of the aluminum alloy substrate using the copper sulfate solution (the first parameter), the chemical expression is stated as followed: $3Cu^{+2}+2Al\rightarrow 3Cu+2Al^{+3}$. For the etching process of the second parameter, the chemical expression is stated as followed: $Al+(PO_4)^{-3}\rightarrow Al(PO_4)_{(aq)}$; $2Al+3(SO_4)^{-2}\rightarrow Al_2(SO_4)_{3(aq)}$; $Al+6HF\rightarrow AlF_{6(aq)}$.

After the etching process, the second pretreatment P2 using the chemical polishing process is performed on the metallic substrate. In other words, a foggy surface is produced on the metallic substrate through the chemical polishing process. To provide further illustrations, the pretreatment P2 includes a step P21 of first pickling on the metallic substrate, a step P22 of chemical polishing on the metallic substrate, and a step P23 of second pickling on the metallic substrate. After each of the aforementioned steps, the metallic substrate is rinsed with water for at least once, where the water rinsing step may range from one to five times. Preferably, two times of water rinsing is implemented.

The pickling process utilizes an acidic solution having a concentration which ranges from 1 to 50 ml/L to perform under a temperature that ranges from 10 to 90 degrees. A preferred parameter for the pickling process of the instant disclosure utilizes a nitric acid solution having a concentration of 20 ml/L under a temperature approximately 25 degrees.

The chemical polishing utilizes one or many acidic solutions having a concentration that ranges from 1 to 85 degrees, such as the phosphoric acid or the sulfuric acid and etc., under a temperature that ranges from 10 to 90 degrees. A preferred parameter for the chemical polishing process of the instant disclosure utilizes a phosphoric acid solution having a concentration of 85% under a temperature that ranges from 90 to 93 degrees for 1 to 10 seconds. It is worth noting that the gloss for the chemical polishing process is suggested to keep less than 6 in order to form the skid-proof leather-texture surface disclosed in the instant disclosure.

Next, the anodic treatment step S3 forms an oxidized film having micro-porous structure on the surface of the metallic substrate. A preferred parameter for the anodic treatment of the instant disclosure is provided in the following table 1.

TABLE 1 parameters regarding the anodic treatment (step S3) of the instant disclosure

| Sub-procedures | Parameter 1 | Parameter 2 |
| --- | --- | --- |
| Anodic treatment | Sulfuric acid and/or oxalic acid or phosphoric acid and/or boric acid and/or tartaric acid 1-95% | Temperature: 5-50° C. Current density: 0.2-3.0 A/dm$^2$ Time spent: 10-60 min |
| Water rinsing | Temperature: 5-95° C. | 1-5 times |

Through experimental results, a preferred parameter for the anodic treatment includes dipping the substrate into a sulfuric acid solution having a concentration that ranges from 20 wt % to 25 wt % under a temperature that ranges from 15 to 25 degrees. Furthermore, the current density is 1.4 A/dm$^2$ and the time spent last for at least 30 minutes. To provide further explanations, the water rinsing process is implemented twice under a temperature of approximately 25 degrees.

A step S4 to activate and increase the dyeing effect of the surface of the metallic substrate is performed after the anodic treatment. Specifically speaking, an activating agent is utilized to enhance the activity of the substrate surface for the latter processes. A parameter for the activating process utilizes an acidic solution having a concentration of 1 to 50 ml/L for 0.1 to 5 minutes under a temperature that ranges from 5 to 95 degrees. Next, 1 to 5 times of water rinsing is implemented. For a preferred parameter of the instant disclosure, a nitric acid solution having a concentration of 20 ml/L is utilized under a temperature approximately 25 degrees before performing two times of water rinsing under the same temperature 25 degrees. The activating process provides the effect of removing the silicone impurities produced by the anodic oxidation to increase the dyeing effect of the metallic substrate.

A step S5 of dyeing the surface of the metallic substrate is performed after the activating process. This dyeing step utilizes a commercial-grade aluminum alloy dye to dye under a temperature that ranges from 5 to 50 degrees for 0.1 to 10 minutes. A preferred parameter suggests a temperature of 40 degrees and a time spent that ranges from 1 to 6 minutes. To provide further explanations, the water rinsing process is implemented also twice under a temperature of approximately 25 degrees.

In order to improve the dirt-proof effect of the oxidized film, a step S6 of sealing is performed to seal the micro-porous structure on the substrate surface by using a sealing agent. Generally, a commercial-grade nickel acetate sealing agent is utilized for sealing after the anodic treatment. The instant disclosure utilizes a commercial-grade nickel acetate sealing agent having a concentration of 1 to 15 g/L under a temperature that ranges from 5 to 95 degrees for 5 to 90 minutes. It is worth noting that the aforementioned commercial-grade nickel acetate sealing agent refers to current sealing agents which consist mainly of nickel acetate salts.

A preferred parameter for the sealing process dips the aluminum alloy substrate in a commercial-grade nickel acetate sealing agent having a concentration of 7 g/L under a temperature of 90±5 degrees for 30 minutes.

Finally, a step S7 of ash-removing to clean the surface of the aluminum alloy substrate is implemented to remove the ash-like substances adhered on the substrate. Generally, the ash-removing process utilizes a dedusting agent which consists mainly of acidic solutions to clean the substrate before water rinsing the substrate. A parameter for the ash-removing process utilizes an acidic solution having a concentration of 1 to 50 ml/L under a temperature that ranges from 5 to 95 degrees. Next, the water rinsing process is implemented 1 to 5 times under a temperature that ranges from 5 to 95 degrees.

In order for the instant disclosure to be adaptable to housings of electronic devices, preferably, the ash-removing process utilizes a nitric acid having a concentration of 20 ml/L under a temperature approximately 25 degrees. Next, the water rinsing process is performed twice under a temperature approximately 25 degrees.

Figure 4:
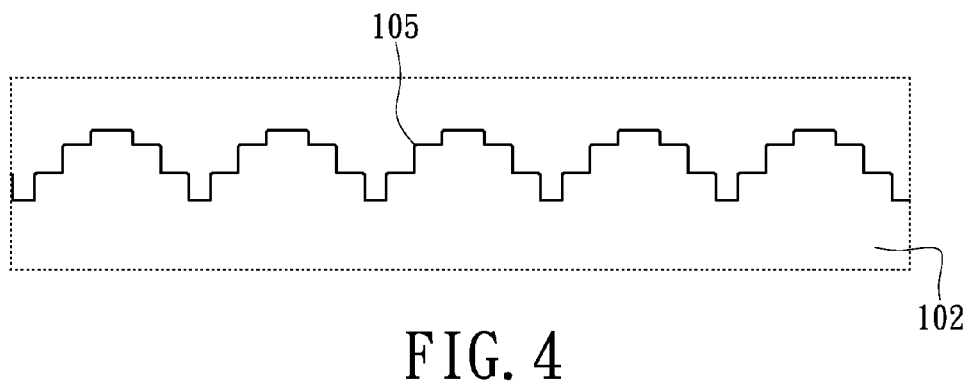
FIG. 4 shows an enlarged perspective view of the surface of the metallic substrate formed from the method in the instant disclosure.

With reference to FIG. 4, after the method of forming a skid-proof leather-texture surface on the metallic substrate, a skid-proof leather-texture surface is formed on the aluminum alloy substrate. After performing the etching process on the metallic substrate surface, an uneven structure 104 is formed thereon. Next, after the processes of chemical polishing, pickling, the anodic treatment and latter processes etc., the uneven structure 104 shown in FIG. 3 is formed into a more delicate particle structure 105. The particle structure 105, after undergoing the etching process and the anodic treatment, will have a leather-texture surface formed thereon. Hence, providing the users with a skid-proof leather-texture sensation when touched.

The texture of the surface, after the etching process of the instant disclosure, will be much similar to a leather-texture surface which is uneven and irregular. Next, the uneven structure will be formed into a more delicate particle structure after the anodic treatment. It is worth noting that such surface is very much different from the surface formed through simply sand-blasting as the surface formed through sand-blasting is rough and ragged with irregular-shaped holes thereon. However, the surface formed through the etching process and the anodic treatment of the instant disclosure is very delicate.

Generally, the electronic devices after having the metallic housing surfaces thereof being processed, the surfaces may be too smooth or even slippery for the users upon holding. Thus, through the method provided in the instant disclosure, a delicate particle structure can be formed on the metallic surface. Accompanied with the etching process of the instant disclosure, a skid-proof leather-texture surface can be formed on the substrate. Therefore, the surface of the metallic substrate of the instant disclosure can provide the users with a leather-texture sensation when touched, meanwhile having a skid-proof effect.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A method of forming a skid-proof leather-texture surface on a metallic substrate, comprising the following steps of:
   providing a metallic substrate,
   roughening the surface of the metallic substrate by performing sand-blasting, wherein the roughness of the surface of the metallic substrate exhibiting a Ra value smaller than 1.1 μm and a RPC value between 100~200/cm;
   cleaning the surface of the metallic substrate;
   etching the surface of the metallic substrate by an etchant at an etching temperature of 40±5 degrees Celsius in an etching time between 1 to 15 minutes while using an etch-moderating agent to moderate the condition of etching, wherein the etchant comprises a final volume percentage of 50%-75% of ammonium bifluoride, 10%-20% of ammonium sulfate, 5~8% of mono-ammonium phosphate, 1%-3% of triammonium phosphate, 1%-2% of ammonium oxalate, 0.32% iron chloride and 0.06% copper sulfate, wherein the etch-moderating agent comprises 50 PPM of sodium dodecylbenzenesulfonate;
   chemical polishing the etched surface of the metallic substrate, wherein the gloss of the chemical polished surface is smaller than 6;
   anodically treating the chemical polished surface of the metallic substrate to form an oxidized film having micro-porous structure thereon;
   activating the micro-porous structure of the oxidized film;
   dyeing the activated micro-porous structure of the oxidized film;
   sealing the dyed micro-porous structure of the oxidized film; and
   removing ash from the metallic substrate and the dyed micro-porous structure.

2. The method of forming a skid-proof leather-texture surface on a metallic substrate according to claim 1, wherein the step of cleaning the surface of the metallic substrate includes a sub-procedure of degreasing and water rinsing on the surface of the metallic substrate.

3. The method of forming a skid-proof leather-texture surface on a metallic substrate according to claim 1, further comprises a step of first pickling before the step of chemical polishing the etched surface of the metallic substrate and a step of second pickling after the step of chemical polishing the etched surface of the metallic substrate includes a pickling and a chemical polishing process to produce a foggy surface on the metallic substrate.

4. The method of forming a skid-proof leather-texture surface on a metallic substrate according to claim 3, wherein the first and second pickling processes use a nitric acid solution of 5 ml/L under a temperature of 25 degrees Celsius.

5. The method of forming a skid-proof leather-texture surface on a metallic substrate according to claim 3, wherein the chemical polishing process uses a phosphoric acid of 85% at a temperature which ranges from 90 to 93 degrees Celsius for 1 to 10 seconds.

6. The method of forming a skid-proof leather-texture surface on a metallic substrate according to claim 1, wherein the metallic substrate is dipped into a sulfuric acid having a concentration that ranges from 20 wt % to 25 wt % in the step of anodically treating the chemical polished surface of the metallic substrate to form an oxidized film having micro-porous structure thereon, where the temperature ranges from 15 to 25 degrees Celsius, the current density is 1.4 A/dm$^2$, and the processing time last for at least 30 minutes.

7. The method of forming a skid-proof leather-texture surface on a metallic substrate according to claim 1, wherein the metallic substrate is dipped into a nitric acid of 20 ml/L at a temperature of 25±5 degrees Celsius in the step of activating the micro-porous structure of the oxidized film.

8. The method of forming a skid-proof leather-texture surface on a metallic substrate according to claim 1, wherein the dyeing step utilizes an aluminum alloy dye to dye the metallic substrate under a temperature that ranges from 5 to 50 degrees Celsius for 0.1 to 10 minutes.

9. The method of forming a skid-proof leather-texture surface on a metallic substrate according to claim 1, wherein the metallic substrate is dipped into a nickel acetate sealing agent having a concentration of 7 g/L under a temperature that ranges from 90±5 degrees Celsius for 30 minutes in the step of sealing the dyed micro-porous structure of the oxidized film.

10. The method of forming a skid-proof leather-texture surface on a metallic substrate according to claim 1, wherein the ash-are removed by utilizing a nitric acid of 20 ml/L under a temperature that ranges from 20±5 degrees Celsius in the step of removing ash from the metallic substrate and the dyed micro-porous structure.

11. The method of forming a skid-proof leather-texture surface on a metallic substrate according to claim 1, wherein ceramic beads are used to perform the sand-blasting in the step of roughening the surface of metallic substrate.

12. The method of forming a skid-proof leather-texture surface on a metallic substrate according to claim 11, wherein the ceramic beads are zirconia powder.

13. The method of forming a skid-proof leather-texture surface on a metallic substrate according to claim 11, wherein the ceramic beads comprise a mixture of zirconia powder and aluminum oxide powder.

14. The method of forming a skid-proof leather-texture surface on a metallic substrate according to claim 11, wherein the ceramic beads are aluminum oxide powder.

* * * * *